(12) United States Patent
Huang et al.

(10) Patent No.: US 10,325,969 B2
(45) Date of Patent: Jun. 18, 2019

(54) DISPLAY PANEL, FABRICATION METHOD AND DISPLAY APPARATUS

(71) Applicant: Shanghai Tianma AM-OLED Co., Ltd., Shanghai (CN)

(72) Inventors: Jingjing Huang, Shanghai (CN); Qiang Fei, Shanghai (CN); Gaojun Huang, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 102 days.

(21) Appl. No.: 15/831,920

(22) Filed: Dec. 5, 2017

(65) Prior Publication Data

US 2018/0097051 A1    Apr. 5, 2018

(30) Foreign Application Priority Data

Aug. 31, 2017  (CN) .......................... 2017 1 0774783

(51) Int. Cl.
*H01L 51/52* (2006.01)
*H01L 27/32* (2006.01)
*H01L 51/56* (2006.01)

(52) U.S. Cl.
CPC ...... *H01L 27/3246* (2013.01); *H01L 27/3276* (2013.01); *H01L 51/5246* (2013.01); *H01L 51/56* (2013.01)

(58) Field of Classification Search
None
See application file for complete search history.

(56) References Cited

U.S. PATENT DOCUMENTS

2015/0171366 A1    6/2015  Kim

*Primary Examiner* — Cheung Lee
(74) *Attorney, Agent, or Firm* — Anova Law Group, PLLC

(57) ABSTRACT

A display panel, a display apparatus and a display panel fabrication method are provided. The display panel comprises an array substrate including a display area and a peripheral area surrounding the display area; a cover; and an inorganic frame sealant. The peripheral area includes a frame encapsulation area, a separation area, and an electronic circuit area, the electronic circuit area is disposed between the display area and the separation area, and the separation area is disposed between the frame encapsulation area and the electronic circuit area. The array substrate includes a first metal layer disposed in the frame encapsulation area and a driving circuit unit disposed at least partially in the electronic circuit area. The first metal layer includes first metal lines configured to supply input signals to the driving circuit unit. The inorganic frame sealant is disposed in the frame encapsulation area, and covers the first metal layer.

20 Claims, 8 Drawing Sheets

DISPLAY PANEL, FABRICATION METHOD AND DISPLAY APPARATUS

CROSS-REFERENCES TO RELATED APPLICATIONS

This application claims the priority of Chinese Patent Application No. 201710774783.2, filed on Aug. 31, 2017, the entire contents of which are incorporated herein by reference.

FIELD OF THE DISCLOSURE

The present disclosure generally relates to the display technology and, more particularly, relates to a display panel, a fabrication method for the display panel, and a display apparatus thereof.

BACKGROUND

As the information technology advances, liquid crystal display (LCD) equipment and organic light-emitting diode (OLED) display equipment become two kinds of mainstream display equipment, which are widely used in various portable electronic equipment.

Because liquid crystal materials or organic light-emitting materials are easy to be degraded by oxygen and moisture, a highly reliable packaging is desired to prevent oxygen and moisture from entering the display panel. Frit sealant/encapsulant is an inorganic frame sealant which can be laser melted and cured, and is often used in the encapsulation of display panels (especially organic light-emitting display panels).

Driving circuits are often configured in the left and right bezel regions of the display panel. The driving circuits often include a plurality of thin-film-transistors (TFTs). To prevent the electrical characteristics of the thin-film-transistors from being degraded by the high temperature generated in the frit packaging process, a separation region is configured between the encapsulation region (the region coated with frit sealant) and the driving circuit region (the region disposed with the driving circuit), thereby preventing the driving circuits from being irradiated by laser light.

Thus, the left and right bezel (or frame) regions are at least configured with an encapsulation region (about 400 μm to 550 μm), a separation region (about 100 μm), and a driving circuit region (about 300 μm to 500 μm), which results a wide left and right bezel of the display panel, and is undesired for narrowing bezel.

The disclosed display panel, fabrication method, and display apparatus thereof are directed to solve one or more problems set forth above and other problems.

BRIEF SUMMARY OF THE DISCLOSURE

One aspect of the present disclosure provides a display panel comprising an array substrate, a cover, and an inorganic frame sealant. The array substrate includes a display area and a peripheral area surrounding the display area, where the peripheral area includes a frame encapsulation area, a separation area, and an electronic circuit area, the electronic circuit area is disposed between the display area and the separation area, and the separation area is disposed between the frame encapsulation area and the electronic circuit area. The inorganic frame sealant bonds the array substrate and the cover together, where the array substrate includes a first metal layer disposed in the frame encapsulation area and a driving circuit unit disposed at least partially in the electronic circuit area, the first metal layer includes a plurality of first metal lines configured to supply input signals to the driving circuit unit, and the inorganic frame sealant is disposed in the frame encapsulation area, and covers the first metal layer.

Another aspect of the present disclosure provides a display apparatus, comprising the disclosed display panel.

Another aspect of the present disclosure provides a fabrication method for a display panel comprising: an array substrate including a display area and a peripheral area surrounding the display area, wherein the peripheral area includes a frame encapsulation area, a separation area, and an electronic circuit area, the electronic circuit area is disposed between the display area and the separation area, and the separation area is disposed between the frame encapsulation area and the electronic circuit area, wherein the fabrication method comprising:

forming a first metal layer in the frame encapsulation area, wherein the first metal layer includes a plurality of first metal lines configured to supply input signals to a driving circuit unit;

forming a second metal layer, wherein the second metal layer includes a plurality of second metal lines that extend from the frame encapsulation area through the separation area to the electronic circuit area;

forming a first inorganic insulation layer, wherein the first inorganic insulation layer is disposed between the first metal layer and the second metal layer, a plurality of first contact holes are formed in the first inorganic insulation layer, and a first metal line is electrically connected to a corresponding second metal line through a first contact hole;

forming the driving circuit unit, wherein the driving circuit unit is disposed at least partially in the electronic circuit area;

coating an inorganic frame sealant in the frame encapsulation area of a cover; and attaching the cover to the array substrate and curing the inorganic frame sealant to bond the cover and the array substrate together, wherein the array substrate includes the driving circuit unit, the first metal layer, the second metal layer, and the first inorganic insulation layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. Other embodiments obtained by those skilled in the art without making creative work are within the scope of the present invention.

Figure 1A:
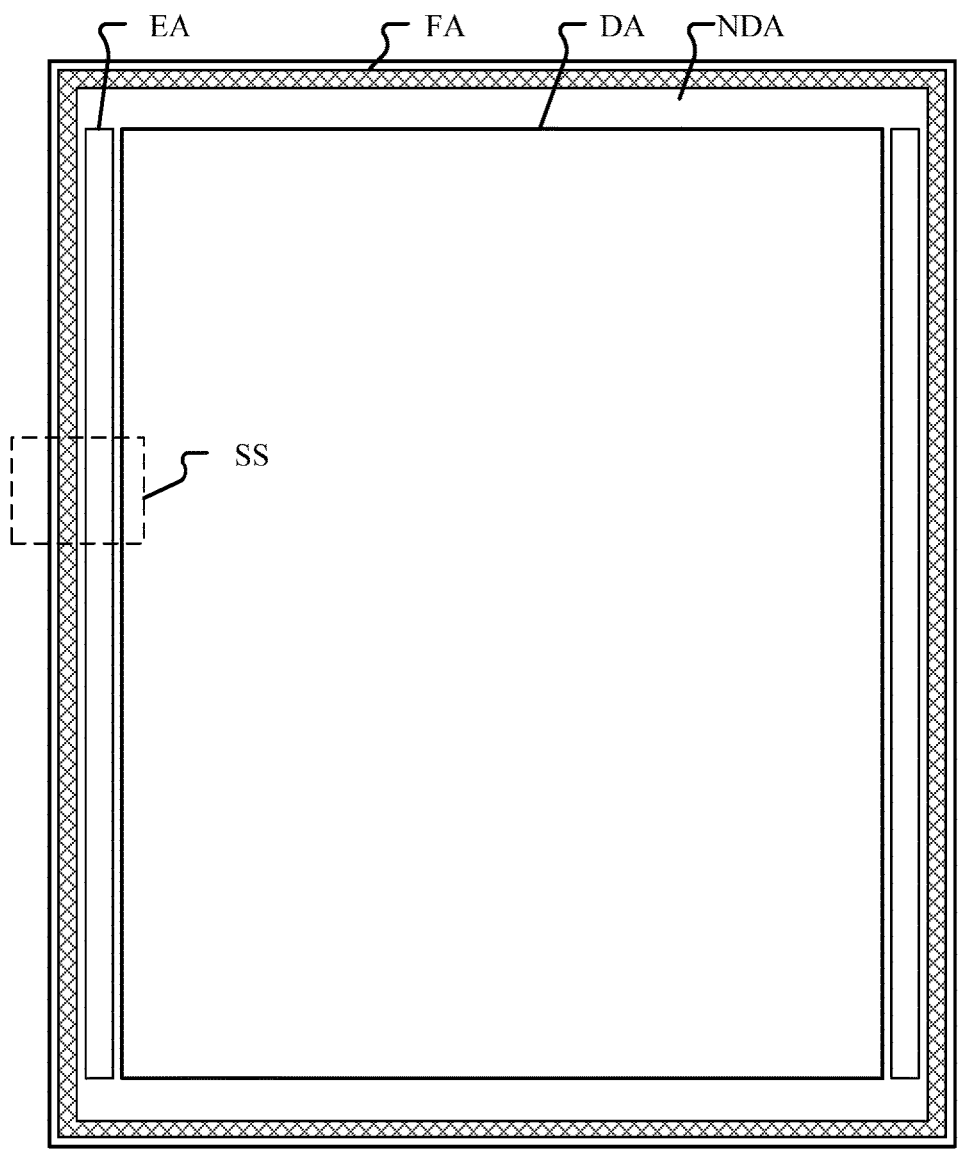
FIG. 1A illustrates a schematic top view of an exemplary display panel according to the disclosed embodiments.
Figure 1B:
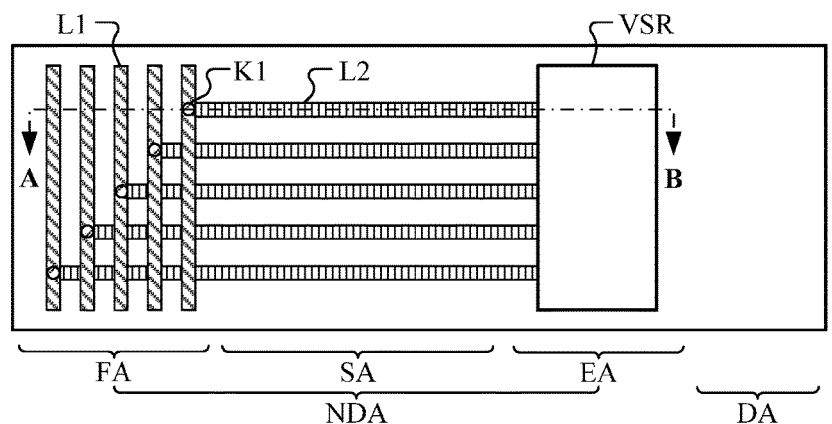
FIG. 1B illustrates an enlarged view of an exemplary region SS in FIG. 1A.
Figure 1C:
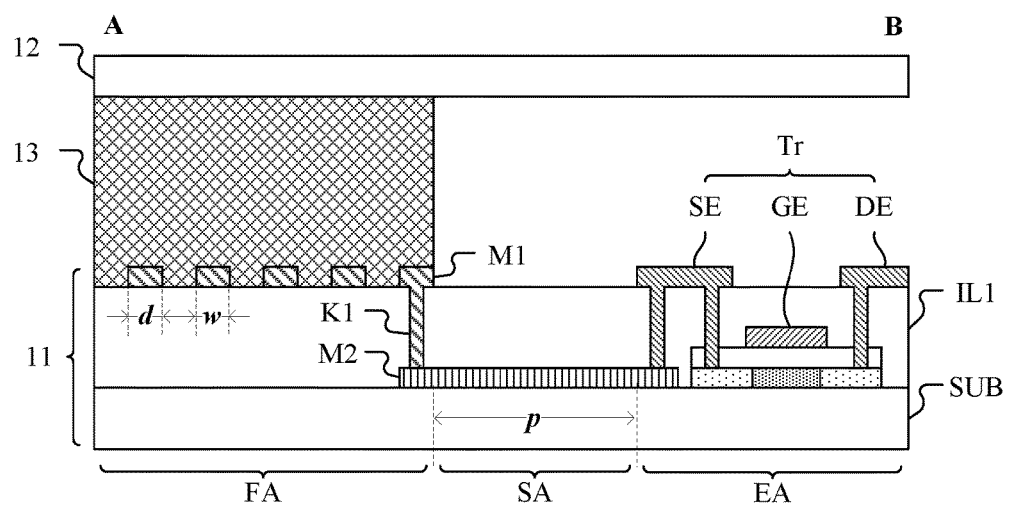
FIG. 1C illustrates a cross-sectional view along the line AB in FIG. 1B.

FIG. 1A illustrates a schematic top view of an exemplary display panel according to the disclosed embodiments. FIG. 1B illustrates an enlarged view of an exemplary region SS in FIG. 1A. FIG. 1C illustrates a cross-sectional view along the line AB in FIG. 1B.

As shown in FIG. 1A, FIG. 1B, and FIG. 1C, the display panel may include an array substrate 11, a cover 12, and an inorganic frame sealant/encapsulant (e.g., frit) 13 to bond the array substrate 11 and the cover 12 together.

The array substrate 11 may include a display area DA and a peripheral area NDA (also known as non-display area) surrounding the display area DA. The peripheral area NDA may include a frame encapsulation area FA, a separation area SA, and an electronic circuit area EA.

The separation area SA may be disposed between the frame encapsulation area FA and the electronic circuit area EA, to prevent the electronic circuit elements (e.g., thin-film-transistors) from being exposed to any external light source (e.g., laser) in the encapsulation process. The electronic circuit area EA may be disposed between the separation area SA and the display area DA for placing electronic circuit elements which are easy to be affected by external light or temperature.

The array substrate 11 may include a first metal layer M1 and a driving circuit unit VSR. The first metal layer M1 may be disposed in the frame encapsulation area FA, and may include a plurality of first metal lines L1. The first metal lines L1 may be configured to supply input signals to the driving circuit unit VSR. The driving circuit unit VSR may be disposed as least partially in the electronic circuit area EA, and may be configured to generate and supply driving signals to each pixel in the display area DA.

The inorganic frame sealant 13 may be disposed in the frame encapsulation area FA, and may cover the first metal layer M1 (i.e., the plurality of the first metal lines L1). In particular, the inorganic frame sealant 13 may be a frit, and the frame sealant sandwiched between the cover 32 and the frame encapsulation area FA may not include any organic frame sealant.

In the encapsulation process, the plurality of the first metal lines L1 may serve as a reflective metal layer to reflect light transmitted through the inorganic frame sealant, and to increase utilization rate of external light source (e.g., laser).

In the disclosed embodiments, on one hand, through disposing the plurality of the first metal lines L1 which supply the input signals to the driving circuit unit VSR in the frame encapsulation area FA as the reflective metal layer, a separate process or step for forming a reflective metal layer in the frame encapsulation area FA may be eliminated, and the fabrication process for the display panel may be simplified.

On the other hand, the plurality of the first metal lines L1 which were used to be disposed in the electronic circuit area EA in the existing display panel and are not sensitive to the external light source, are now disposed in the frame encapsulation area FA, which actually may be equivalent to dividing the driving circuit area in the existing display panel into two areas. One of the two areas may be configured to dispose circuit elements that are sensitive to external light source and temperature, i.e., the electronic circuit area EA in the disclosed embodiment, while the other of the two areas may be configured to dispose the plurality of the first metal lines L1 that are not sensitive to the external light source and temperature, i.e., the frame encapsulation area FA in the disclosed embodiment.

In other words, the layout area occupied by the electronic circuit area EA and the frame encapsulation area FA in the disclosed embodiment may be approximately the same as the layout area occupied by the driving circuit area in the existing display panel. Compared to the existing display panel, the width of the display panel in the disclosed embodiments may be approximately reduced by a width of the existing frame encapsulation area (i.e., frame encapsulation area in the existing technology), e.g., approximately 400 μm to 550 μm. Thus, the area of the peripheral area NDA (two side bezels) of the display panel may be substantially reduced.

In the disclosed embodiments, through configuring the plurality of the first metal lines L1 in the frame encapsulation area FA, the layout area occupied by both the electronic circuit area EA and the frame encapsulation area FA may be simultaneously reduced such that the bezel area/frame area of the display panel may be reduced to narrow the bezel.

The display panel may be a plasma display panel, a field emission display panel, a light-emitting diode (LED) display panel, an organic light-emitting diode (OLED) display panel, a liquid crystal display panel, a quantum dots (QDs) display panel, or an electrophoretic display panel, etc. Further, the display panel may include any appropriate type of display panels capable of displaying videos and images.

It should be understood by those skilled in the art that the display panel in the disclosed embodiments may be also include other well-known structures.

For example, when the display panel is a liquid crystal display panel, the display panel may also include a liquid crystal layer configured between the array substrate 11 and the cover 12. When the display panel is an organic light-emitting display panel, the display panel may also include a plurality of organic light-emitting diodes configured between the array substrate 11 and the cover 12. Those well-known structures will not be described in detail here.

In one embodiment, the first metal line L1 may be electrically connected to driving circuit unit VSR through a second metal line L2. A corresponding structure is shown in FIG. 1B and FIG. 1C.

As shown in FIG. 1B and FIG. 1C, the array substrate 11 may also include a first inorganic insulation layer IL1 and a second metal layer M2. The first inorganic insulation layer IL1 may be disposed between the first metal layer M1 and the second metal layer M2. The second metal layer M2 may include a plurality of the second metal lines L2.

At least a portion of the first inorganic insulation layer IL1 may directly contact the inorganic frame sealant 13. A plurality of first contact holes K1 may be configured in the first inorganic insulation layer IL1. The first metal line L1 may be electrically connected to the corresponding second metal line L2 through the first contact hole K1. The plurality of the second metal lines L2 may extend from the frame encapsulation area FA through the separation area SA to the electronic circuit area EA, and may be electrically connected to the driving circuit unit VSR, for example, through the contact holes K1.

As shown in FIG. 1B, each second metal line L2 may intersect with a plurality of first metal lines L1. Because one second metal line L2 is electrically connected to only one first metal line L1, some second metal lines L2 may intersect/cross the first metal lines L1 and may be insulated from the first metal lines L1. That is, the first metal layer M1 and the second metal layer M2 may have to be disposed in different metal layers.

In the disclosed embodiments, through configuring the second metal layer M2 in the display panel, the first metal lines L1 may be electrically connected to the driving circuit unit VSR, such that input signals may be transferred from the frame encapsulation area FA to the electronic circuit area EA.

Moreover, the first metal layer may have a single layer structure or a multiple layer structure, such as a Ti/Al/Ti three-layer structure. Surface roughness of the metal layer (e.g., titanium) may be small. When the first metal layer M1 directly contacts the inorganic frame sealant 13, the bonding force between the inorganic frame sealant 13 and the first metal layer M1 may be substantially weak.

As shown in FIG. 1C, because a gap exists between adjacent first metal lines L1, after the first inorganic insulation layer IL1 is disposed in the display panel, the first inorganic insulation layer IL1 may directly contact the inorganic frame sealant 13 in the gaps. The first inorganic insulation layer IL1 may have a substantially greater surface roughness than the metal surface. That is, the bonding force between the inorganic frame sealant 13 and the first inorganic insulation layer IL1 may be substantially stronger than the bonding force between the inorganic frame sealant 13 and the first metal layer M1. Thus, the encapsulation reliability of the display panel may be improved.

Although FIG. 1C illustrates that the second metal layer M2 is configured on a side of the first metal layer M1 in a direction toward the substrate SUB, and the first metal layer directly contacts the inorganic frame sealant 13, which is for illustrative purposes and is not intended to limit the scope of the present disclosure. In another embodiment, the second metal layer M2 may be configured on a side of the first metal layer in a direction far away from the substrate SUB, and the first metal layer M1 may not be directly in contact with the inorganic frame sealant 13.

Although FIG. 1C illustrates that the second metal layer M2 is coplanar with a semiconductor layer of the driving circuit unit VSR, which is for illustrative purposes and is not intended to limit the scope of the present disclosure. The second metal layer M2 may not be coplanar with the semiconductor layer of the driving circuit unit VSR. It should be understood by those skilled in the art that because multiple film layers of the electronic circuit area EA may be etched away in the frame encapsulation area FA and the separation area SA, the location relationship similar to FIG. 1C may be formed.

Figure 2:
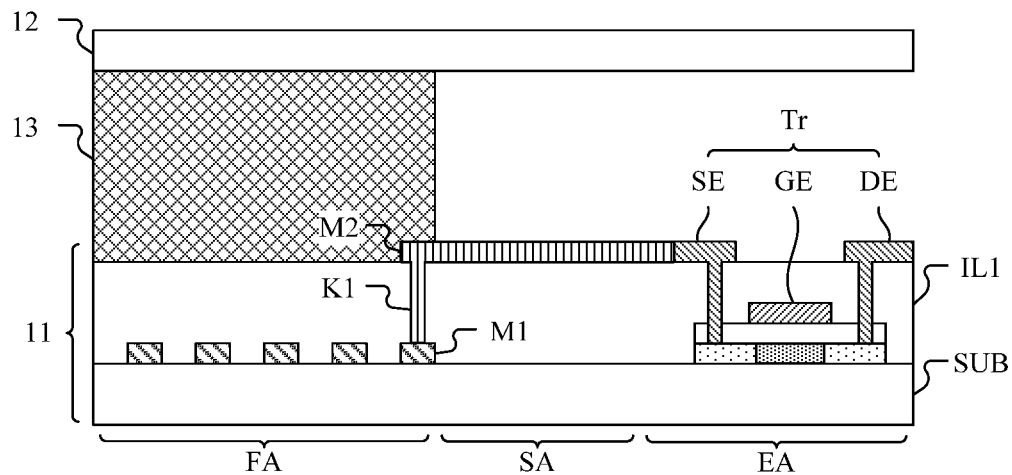
FIG. 2 illustrates a schematic cross-sectional view of another exemplary display panel according to the disclosed embodiments.

FIG. 2 illustrates a schematic cross-sectional view of another exemplary display panel according to the disclosed embodiments. The similarities between FIG. 2 and FIG. 1C are not repeated, while certain difference may be explained. As shown in FIG. 2, the first inorganic insulation layer IL1 may cover the first metal layer M1, and may directly contact the inorganic frame sealant 13. The second metal layer M2 may be configured on the first inorganic insulation layer IL1, and may directly contact the inorganic frame sealant 13.

When the first metal layer M1 directly contacts the inorganic frame sealant 13, the inorganic frame sealant 13 may directly contact the first inorganic insulation layer IL1 only in the gaps between the first metal lines L1. The contact area between the inorganic frame sealant 13 and the first inorganic insulation layer IL1 may be determined by an area of the gap between the first metal lines L1.

In the disclosed embodiments, through configured the first metal layer M1 between the second metal layer M2 and the substrate SUB, the first inorganic insulation layer IL1 may directly contact the inorganic frame sealant 13. In other words, the gap area between the first metal lines L1 may not affect the contact area between the inorganic frame sealant 13 and the first inorganic insulation layer IL1. The inorganic frame sealant 13 may pretty much contact the entire surface of the first inorganic insulation layer IL1. Thus, the encapsulation reliability of the display panel may be improved.

In one embodiment, the material of the first inorganic insulation layer IL1 may include at least one of $SiO_2$, $SiN_x$, and SiON. The inorganic frame sealant 13 may include an adhesive containing Si.

When the materials of both the first inorganic insulation layer IL1 and the inorganic frame sealant 13 include silicon, an inter-molecule force at the contact surface between the first inorganic insulation layer IL1 and the inorganic frame sealant 13 may be greater than an inter-molecule force at the contact surface between the first inorganic insulation layer IL1 and the inorganic frame sealant 13 when at least one of the first inorganic insulation layer IL1 and the inorganic frame sealant 13 does not include silicon. Thus, through configuring both the first inorganic insulation layer IL1 and the inorganic frame sealant 13 to include a material including silicon, the encapsulation reliability of the display panel may be further improved.

Moreover, the electrical connection between the second metal lines L2 and the driving circuit unit VSR may be realized in various ways. As shown in FIG. 1C and FIG. 2, in one embodiment, the second metal lines L2 may be electrically connected to the driving circuit unit VSR through the contact holes (as FIG. 1C shows), in another embodiment, the second metal lines L2 may be electrically connected to the driving circuit unit VSR directly without going through the contact holes (as FIG. 2 shows), which is not limited by the present disclosure.

Figure 3A:
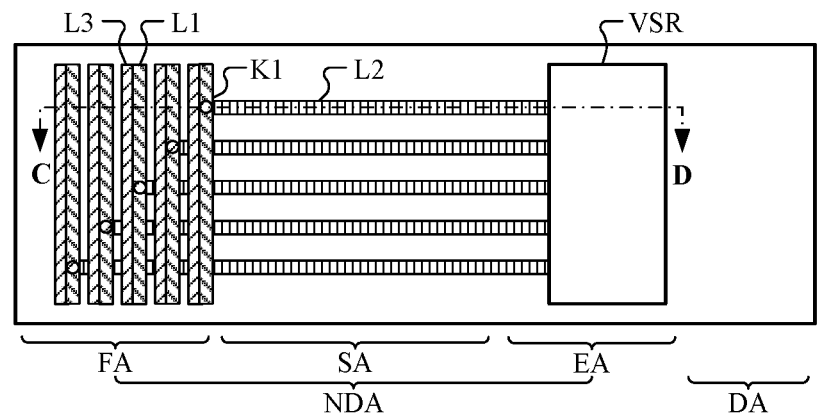
FIG. 3A illustrates an enlarged view of another exemplary region SS in FIG. 1A.
Figure 3B:
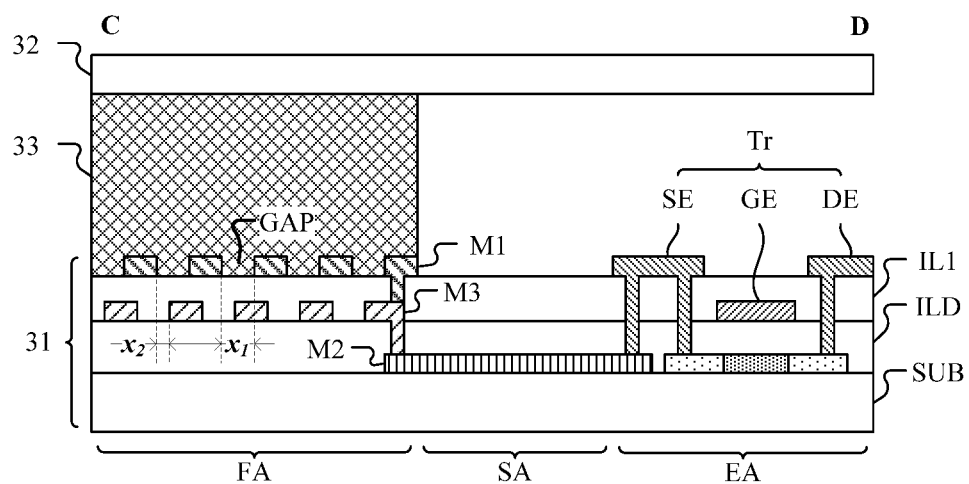
FIG. 3B illustrates a cross-sectional view along the line CD in FIG. 3A.

FIG. 3A illustrates an enlarged view of another exemplary region SS in FIG. 1A. FIG. 3B illustrates a cross-sectional view along the line CD in FIG. 3A. The similarities between FIG. 3A and FIG. 1B and between FIG. 3B and FIG. 2 are not repeated, while certain difference may be explained.

Similar to the embodiments shown in FIG. 1A, FIG. 1B, and FIG. 1C, the display panel shown in FIGS. 3A-3B may also include an array substrate 31, a cover 32, and an inorganic frame sealant 33. Similarly, the array substrate 31 may include a first metal layer M1, a second metal layer M2, and a driving circuit unit VSR. The first metal layer M1 may be configured in the frame encapsulation area FA, and may include a plurality of first metal lines L1. The second metal layer M2 may include a plurality of second metal lines L2. The first metal lines L1 may be electrically connected to the driving circuit unit VSR through the second metal lines L2.

Different from the embodiments shown in FIG. 1A, FIG. 1B, and FIG. 1C, the array substrate 31 shown in FIGS. 3A-3B may also include an insulation layer ILD and a third metal layer M3 configured in the frame encapsulation area FA. The insulation layer ILD may be disposed between the third metal layer M3 and the second metal layer M2. The third metal layer M3 may be disposed between the first inorganic insulation layer IL1 and the insulation layer ILD. The first inorganic insulation layer IL1 may be disposed between the first metal layer M1 and the third metal layer M3. The first metal layer M1, the second metal layer M2, and the third metal layer M3 may not be coplanar with each other. That is, the first metal layer M1, the second metal layer M2, and the third metal layer M3 each may be disposed in a different layer.

The third metal layer M3 may include a plurality of third metal lines L3. The third metal lines L3 may be one-to-one corresponding electrically connected to the first metal lines L1. An orthogonal projection of the third metal lines L3 on the first metal layer M1 may at least partially overlap the gaps between the first metal lines L1. For example, the gap GAP between adjacent first metal lines L1 may have a minimum width $x_1$. A region in the gap GAP that is not covered by the orthogonal projection of the third metal line L3 may have a minimum width $x_2$. Then, $x_2 < x_1$.

In the disclosed embodiments, on one hand, the third metal layer M3 may be disposed between the first inorganic insulation layer IL1 and the insulation layer ILD, and the third metal lines L3 may be one-to-one corresponding electrically connected to the first metal lines L1, which may be equivalent to connecting the first metal lines L1 and the third metal lines L3 in parallel. Compared to a single input signal line (e.g., a first metal line L1), two input signal lines (i.e., a first metal line L1 and a third metal line L3) may be connected in parallel to reduce resistance. Thus, when the first metal lines L1 and the third metal lines L3 are connected in parallel to transmit input signals, the stability of the input signals that are supplied to the driving circuit unit VSR may be further enhanced.

On the other hand, the third metal layer M3 and the first metal layer may not be coplanar with each other, and the third metal lines L3 may at least partially overlap the gap GAP between adjacent first metal lines L1. Thus, the metal reflection area may be increased to reflect more light (e.g., laser light) passing through the inorganic frame sealant 33, such that the utilization rate of the external light source may be further increased to ensure sufficient energy available to melt the inorganic frame sealant 33. Meanwhile, through increasing the metal reflection area by introducing the third metal layer M3, the line width of the first metal line L1 may be reduced accordingly. Thus, the contact area between the inorganic frame sealant 33 and the first inorganic insulation layer IL1 may be increased to enhance the bonding between the inorganic frame sealant 33 and an encapsulation substrate (here, the encapsulation substrate is a film layer that directly contacts the inorganic frame sealant 33, for example, the first inorganic insulation layer IL1, or the first metal layer M1, etc.)

In the disclosed embodiments, the third metal layer M3 may be configured to one-to-one corresponding electrically connect the third metal lines L3 to the first metal lanes L1, and the gaps between the first metal lines L1 may at least partially overlap with the third metal lines L3. Not only the resistance of the input signal lines may be reduced, but also the metal reflection area may be increased. Thus, the stability of the input signals and reliability of the encapsulation may be improved.

In one embodiment, as shown in FIG. 3B, the orthogonal projection of the third metal lines on the first metal layer M1 partially overlap the gaps GAP. In another embodiment, an orthogonal projection of the third metal lines L3 on the first metal layer M1 may completely cover the gaps GAP between the first metal lines L1. A corresponding structure is shown in FIG. 4.

Figure 4:
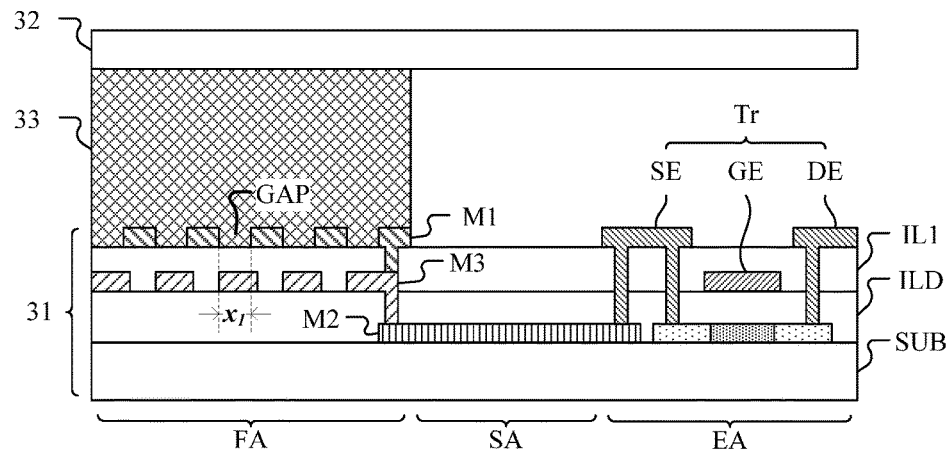
FIG. 4 illustrates a schematic cross-sectional view of another exemplary display panel according to the disclosed embodiments.

FIG. 4 illustrates a schematic cross-sectional view of another exemplary display panel according to the disclosed embodiments. The similarities between FIG. 4 and FIG. 3B are not repeated, while certain difference may be explained.

As shown in FIG. 3B, when the orthogonal projection of the third metal lines on the first metal layer M1 partially overlap the gaps GAP, a portion of the gap GAP area (e.g., the portion of the minimum line width is $x_2$) may not be able to reflect light passing through the inorganic frame sealant. Thus, a certain portion of light passing through the inorganic frame sealant may be lost.

As a comparison, as shown in FIG. 4, an orthogonal projection of the third metal lines L3 on the first metal layer M1 may completely cover the gaps GAP. That is, the gaps GAP may not include any transparent areas (i.e., $x_2=0$). In other words, light passing through the inorganic frame sealant 33 may be totally reflected by the first metal lines L1 and the third metal lines L3. Thus, the utilization rate of the external light source may be maximized.

In the disclosed embodiment shown in FIG. 4, through configuring the orthogonal projection of the third metal lines L3 on the first metal layer M1 to completely cover the gaps between the first metal lines L1, the metal reflection area may be increased, and the inorganic frame sealant 33 may be melt more sufficiently accordingly.

FIG. 3A, FIG. 3B, and FIG. 4 illustrate an order of the first metal layer M1, the second metal layer M2, and the third metal layer M3, which is for illustrative purposes and is not intended to limit the scope of the present disclosure. It should be understood that the first metal layer M1, the second metal layer M2, and the third metal layer M3 may be stacked in any appropriate order, such as M2/M1/M3, M3/M2/M1, M3/M1/M2, M1/M2/M3, or M1/M3/M2, as long as the orthogonal projection of the third metal lines L3 on the first metal layer M1 at least partially overlaps the gaps GAP between the first metal lines L1. Those skilled in the art may configure the order of the first metal layer M1, the second metal layer M2, and the third metal layer M3 according to various practical application scenarios.

Figure 5:
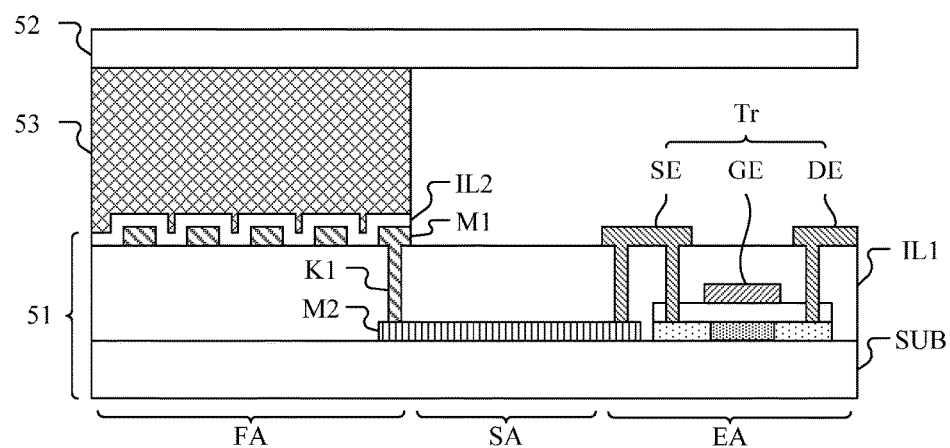
FIG. 5 illustrates a schematic cross-sectional view of another exemplary display panel according to the disclosed embodiments.

FIG. 5 illustrates a schematic view of another exemplary display panel according to the disclosed embodiments. The similarities between FIG. 5 and FIGS. 1A-1C are not repeated, while certain difference may be explained.

Similar to the display panel shown in FIG. 1A, FIG. 1B, and FIG. 1C, the display panel shown in FIG. 5 may include an array substrate 51, a cover 52, and an inorganic frame sealant 53. The array substrate 51 may include a first metal layer M1, a second metal layer M2, and a driving circuit unit VSR. The first metal layer M1 may be disposed in the frame encapsulation area FA, and may include a plurality first metal lines L1. The second metal layer M2 may include a plurality of second metal lines L2. The first metal lines L1 may be electrically connected to the driving circuit unit VSR through the second metal lines L2.

Different from the display panel shown in FIG. 1A, FIG. 1B, and FIG. 1C, the array substrate 51 shown in FIG. 5 may also include a second inorganic insulation layer IL2. The second inorganic insulation layer IL2 may be disposed between the first metal layer M1 and the inorganic frame sealant 53.

Because the first metal layer M1 may be disposed between the first inorganic insulation layer IL1 and the inorganic frame sealant 53, and the surface bonding force between the inorganic frame sealant 53 and the first metal layer M1 may be weaker than the bonding force between the inorganic frame sealant 53 and the first inorganic insulation layer IL1 the encapsulation of the display panel may be adversely affected.

In the display panel shown in FIG. 5, the second inorganic insulation layer IL2 may be configured between the first metal layer M1 and the inorganic frame sealant. Even when the first metal layer M1 is disposed on the first inorganic insulation layer IL1 the inorganic frame sealant 53 may not directly contact the first metal layer M1. Thus, the contact area between the inorganic frame sealant 53 and the inorganic insulation layer (second inorganic insulation layer) may be increased, and the encapsulation reliability of the display panel may be improved.

Figure 6A:
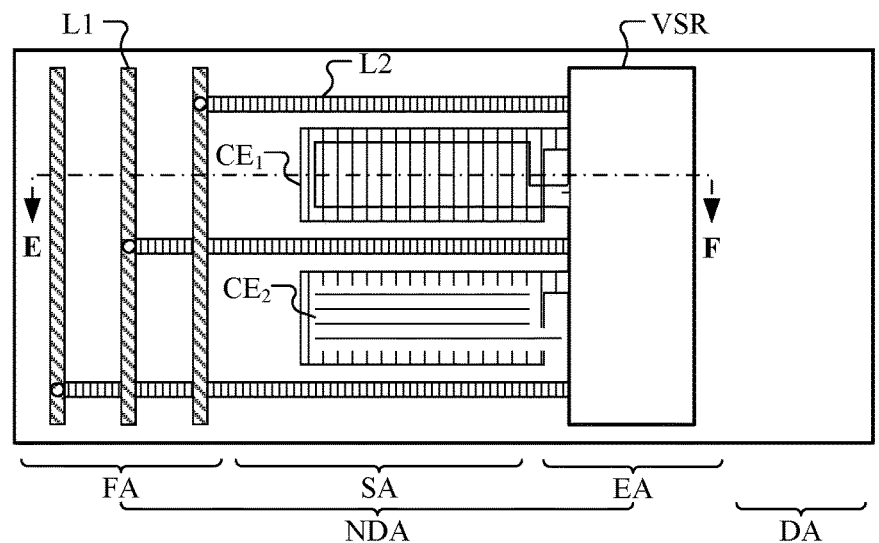
FIG. 6A illustrates a schematic cross-sectional view of another exemplary display panel according to the disclosed embodiments.
Figure 6B:
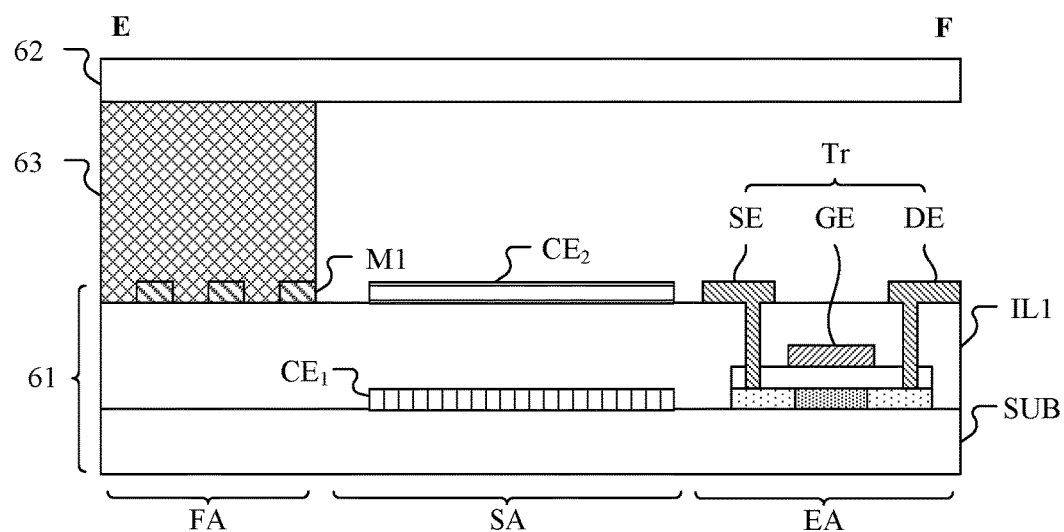
FIG. 6B illustrates a cross-sectional view along the line EF in FIG. 6A.

FIG. 6A illustrates a schematic cross-sectional view of another exemplary display panel according to the disclosed embodiments. FIG. 6B illustrates a cross-sectional view along the line EF in FIG. 6A. The similarities between FIG. 5 and FIGS. 1A-1C are not repeated, while certain difference may be explained.

Similar to the embodiments shown in FIG. 1A, FIG. 1B, and FIG. 1C, the display panel may include an array substrate 61, a cover 62, and an inorganic frame sealant 63. The array substrate 61 may include a first metal layer M1, a second metal layer M2, and a driving circuit unit VSR. The first metal layer M1 may be disposed in the frame encapsulation area FA, and may include a plurality of first lines L1. The second metal layer M2 may include a plurality of second metal lines L2. The first metal lines L1 may be electrically connected to the driving circuit unit VSR through the second metal lines L2.

Different from the display panel shown in FIG. 1A, FIG. 1B, and FIG. 1C, the display panel shown in FIG. 6A and FIG. 6B may further limit the driving circuit unit VSR.

As shown in FIG. 6A and FIG. 6B, the driving circuit unit VSR may include at least one capacitor. The capacitor may include a first capacitor electrode plate $CE_1$ and a second capacitor electrode plate $CE_2$. The first capacitor electrode plate $CE_1$ and the second capacitor electrode plate $CE_2$ may be disposed in at least one of the separation area SA and the frame encapsulation area FA.

The first inorganic insulation layer IL1 may be disposed between the first capacitor electrode plate $CE_1$ and the second capacitor electrode plate $CE_2$, as a dielectric layer of the capacitor. When the a first voltage is applied to the first capacitor electrode plate $CE_1$ and a second voltage is supplied to the second capacitor electrode plate $CE_2$, the first capacitor electrode pate $CE_1$ and the second capacitor electrode plate $CE_2$ may form a capacitor in the overlapping area.

On one hand, the driving circuit unit VSR often includes a plurality of capacitors, and compared to other circuit elements in the driving circuit unit VSR, the capacitors may occupy a substantially large layout area. Meanwhile, the capacitors are often not susceptible/sensitive to high temperature. That is, the high temperature generated in the encapsulation process may have negligible effect on the electric characteristic of the capacitors. Thus, through configuring the capacitors in an area other than the electronic circuit area EA, the layout area occupied by the electronic circuit area EA may be substantially reduced.

On the other hand, because the separation area SA is intended for preventing the external light source from irradiating on the electronic circuit area EA, the separation area SA often does not include any circuit elements in the existing display panels. In the disclosed embodiment shown in FIG. 6A and FIG. 6B, the capacitors may be configured in the separation area SA, which may be equivalent to rearranging the layout area occupied by the capacitors in the electronic circuit area to form the separation area SA, such that not only the utilization rate of the separation area SA may be increased, but also the layout area occupied by the electronic circuit area EA may be substantially reduced without increasing the layout area occupied by the frame encapsulation area FA and the separation area SA. Accordingly, the layout area occupied by the peripheral area may be reduced substantially.

Compared to the existing display panel, in the disclosed display panel, the width of the frame encapsulation area (i.e., the encapsulation area in the existing technology) and the width of the separation area (i.e., the separation area in the existing technology) may be reduced by, for example, approximately 500 μm to 650 μm. Thus, the area occupied by the peripheral area NDA (both side bezels) may be further reduced to facilitate narrow bezel design.

In one embodiment, the first capacitor electrode plate $CE_1$ and the second capacitor electrode plate $CE_2$ may be configured in the separation area SA.

Because high temperature (e.g., approximately 500° C. to 600° C. in the area irradiated by laser) generated in the encapsulation process may affect the dielectric characteristic of the dielectric layer (e.g., the first inorganic insulation layer IL1) between the first capacitor electrode plate $CE_1$ and the second capacitor electrode plate $CE_2$, while after the heat is transferred to the separation area SA, the temperature at the separation area SA may be substantially low, for example, lower than approximately 350° C., which may not affect the characteristics of the dielectric layer. Thus, through configuring the capacitors in the driving circuit unit VSR to be disposed in the separation area SA, the stabilities of the electrical characteristics of the capacitors may be further improved.

The capacitors shown in FIG. 6A and FIG. 6B are configured in the separation area SA, which is for illustrative purposes and is not intended to limit the scope of present disclosure.

In another embodiment, the capacitors (i.e., the first capacitor electrode plates $CE_1$ and the second capacitor electrode plates $CE_2$) may be configured in the frame encapsulation area FA. The first capacitor electrode plate $CE_1$ and the second capacitor electrode plate $CE_2$ may be made of metallic material, and may be able to reflect external light. When the capacitors are configured in the frame encapsulation area FA, the capacitors may be used as reflective metal layers, and may further increase the utilization rate of frame encapsulation area FA. Thus, through configuring the capacitors in the frame encapsulation area FA, the layout area occupied by the electronic circuit area EA may also be substantially reduced without increasing the layout area occupied by the frame encapsulation area FA, which may be desired for narrow bezel design.

In another embodiment, the capacitors (i.e., the first capacitor electrode plates $CE_1$ and the second capacitor electrode plates $CE_2$) may be configured in both the separation area SA and the frame encapsulation area FA, such that the utilization rates of the separation area SA and the frame encapsulation area FA may be increased, and substantial reduction of the layout area occupied by the electronic circuit area EA may be ensured without increasing the layout areas occupied by the separation area SA and the frame encapsulation area FA. Even when the driving circuit unit VSR includes a substantially large number of capacitors, the layout area may still be sufficient for the capacitors. Thus, the layout area occupied by the peripheral area NDA may be minimized.

In one embodiment, one of the first capacitor electrode plate $CE_1$ and the second capacitor electrode plate $CE_2$ may be configured coplanar with the first metal layer M1. The other may be configured coplanar with the second metal layer M2.

For example, as shown in FIG. 6A, the first capacitor electrode plate $CE_1$ may be configured coplanar with the second metal layer M2. As shown in FIG. 6B, the second capacitor electrode plate $CE_2$ may be configured coplanar with first metal layer M1.

Through respectively configuring the two electrode plates of the capacitor coplanar with the first metal layer M1 and the second metal layer M2, the first metal layer M1 and the second metal layer M2 may be fabricated at the same time as the capacitor. Thus, the fabrication process of the display panel may be simplified, and the production cost of the display panel may be reduced.

In another embodiment, when the display panel also includes a third metal layer (the third metal layer M3 as shown in FIG. 3B), one of the first capacitor electrode plate $CE_1$ and the second capacitor electrode plate $CE_2$ may be configured coplanar with the third metal layer M3.

The first capacitor electrode plate $CE_1$ may be configured coplanar with the second metal layer M2 as shown in FIG. 6A, and the second capacitor electrode plate $CE_2$ may be configured coplanar with the first metal layer M1 as shown in FIG. 6B, and the first inorganic insulation layer IL1 may be the dielectric layer, which are for illustrative purposes and are not intended to limit the scope of the present disclosure. In certain embodiments, the first capacitor electrode plate $CE_1$ may not be configured coplanar with the second metal layer M2. In certain other embodiments, the second capacitor electrode plate $CE_2$ may not be configured coplanar with the first metal layer M1. In certain other embodiments, the second capacitor electrode plate $CE_2$ may not be configured coplanar with the first metal layer M1, and the first capacitor electrode plate $CE_1$ may not be configured coplanar with the second metal layer M2. Other insulation layer may be configured as the dielectric layer. Those skilled in the art may determine which insulation layer is configured as the dielectric layer according to the practical application scenarios.

In the disclosed embodiments, in addition to the capacitors, the driving circuit unit (e.g., the driving circuit unit VSR shown in FIG. 1B, FIG. 3A, and FIG. 6A) may also include other circuit elements.

In one embodiment, the driving circuit unit may also include thin-film-transistors (TFT) configured in the electronic circuit area EA.

In particular, as shown in FIG. 1C, FIG. 2, FIG. 3B, FIG. 4, FIG. 5, and FIG. 6B, the driving circuit unit VSR may also include a plurality of TFTs Tr, the plurality of the TFTs may be as least partially disposed in the electronic circuit area EA and, meanwhile, may be disposed outside the frame encapsulation area FA. Each TFT Tr may include a gate electrode GE, a source electrode SE, and a drain electrode DE. One of the source electrode SE and the drain electrode DE may be electrically connected to a second metal line (e.g., the second metal line L2 shown in FIG. 1B, FIG. 3A, and FIG. 6A).

Because the high temperature generated in the encapsulation process of the display panel affects the electrical characteristics the TFTs Tr, through disposing the TFTs Tr in the electronic circuit area EA, the TFFTs Tr may be prevented from being affected by the high temperature. Thus, the TFTs Tr may maintain the desired electrical characteristics.

In certain embodiments, the array substrate may also include a gate metal layer and a source-drain metal layer. The gate metal layer may include a plurality of gate electrodes. The source-drain metal layer may include a plurality of source electrodes and a plurality of drain electrodes.

In particular, one of the gate metal layer and the source-drain metal layer may be configured coplanar with the first metal layer, and the other of the gate metal layer and the source-drain metal layer may be configured coplanar with the second metal layer.

In one embodiment, as shown in FIG. 1C, the gate metal layer including the gate electrode GE may be configured coplanar with the second metal layer M2. The source-drain metal layer including the source electrode SE and the drain electrode DE may be configured coplanar with the first metal layer M1.

In another embodiment, as shown in FIG. 2, the gate metal layer including the gate electrode GE may be configured coplanar with the first metal layer M1. The source-drain metal layer including the source electrode SE and the drain electrode DE may be configured coplanar with the second metal layer M2.

Through configuring the two electrode layers of the TFTs coplanar with the first metal layer and the second metal layer respectively, the fabrication process of the display panel may be simplified, and the production cost of the display panel may be reduced.

In certain embodiments, the first metal lines (e.g., the first metal lines L1 shown in FIG. 1B, FIG. 3A, and FIG. 6A) may be configured as both the input signal lines and the reflective metal layer. To obtain desired signal transmission characteristics and reflection characteristics, the first metal lines L1 may be configured to have a certain line width.

In one embodiment, the line width w of the first metal lines L1 may be approximately 30 $\mu m \leq w \leq 150$ $\mu m$, as shown in FIG. 1C.

Through configuring the line width w of the first metal lines L1 between 30 μm and 150 μm (including both ends), on one hand, the resistance of the first metal lines may be substantially small. Thus, the first metal lines may have the desired signal transmission characteristics. On the other hand, because the line width may be also desired for the first metal lines L1 to reflect the external light which is transmitted through the inorganic frame sealant, thereby allowing a substantially high utilization rate of the external light source.

In addition, the inorganic frame sealant may be deformed in the encapsulation process. When the line width of the first metal lines is substantially small, the deformation (or strain)

may be accumulated along the extension direction of the first metal lines L1, thereby resulting in wrinkle and breakage. However, the line width w of the first metal lines L1 may sustain the strain and deformation in the encapsulation process, and may be unlikely to wrinkle or break, thereby improving the reliability of the display panel.

In one embodiment, a minimum distance d between two adjacent first metal lines L1 may be configured to be approximately 2 µm≤d≤100 µm, as shown in FIG. 1C.

Through configuring the minimum distance between two adjacent first metal lines L1 to be approximately between 2 µm and 100 µm (including both ends), sufficient contact area (when the inorganic frame sealant directly contacts the first metal lines) between the inorganic frame sealant and the first inorganic insulation layer may be available to ensure a strong bonding force between the inorganic frame sealant and the encapsulation substrate. Thus, the desired encapsulation reliability of the display panel may be achieved.

In one embodiment, a minimum distance p between the frame encapsulation area FA and the electronic circuit area EA may be approximately 30 µm≤p≤200 µm.

As shown in FIG. 1C, the minimum width p of the separation area SA may be configured to be approximately 30 µm≤p≤200 µm.

Through configuring the width p of the separation area SA to be within the range approximately between 30 µm and 200 µm, on one hand, the said width configuration may ensure that the external light source may not irradiate on the electronic circuit area EA in the encapsulation process of the display panel. Thus, the electrical characteristics of the circuit elements (e.g., TFTs Tr) in the driving circuit unit VSR may not be affected by the laser or the high temperature. On the other hand, when the circuit elements (e.g., capacitors) in the driving circuit unit VSR which are not susceptible to the laser or the high temperature are going to be configured in the separation area SA, sufficient layout area may be available for the circuit elements (e.g., capacitors).

In one embodiment, a plurality of openings may be configured in the first metal lines L1. The openings may be go through the first metal lines L1.

When the first metal lines (e.g., the first metal lines L1 shown in FIG. 1B, FIG. 3A, and FIG. 6A) have a substantially large line width, for example, larger than 100 µm, the metal itself may produce a metal stress in response to a temperature change (e.g., the temperature change in the encapsulation process). The first metal lines L1 may warp and deform, such that the encapsulation performance may be degraded. Through configuring a plurality of openings in the first metal lines L1, on one hand, the metal stress of the first metal lines L1 may be relieved sufficiently to avoid the deformation of the first metal lines L1. On the other hand, the contact area between the inorganic frame sealant and the first inorganic insulation layer may be increased, such that the bonding force between the inorganic frame sealant and the encapsulation substrate may be further enhanced.

In one embodiment, when the display panel also includes third metal lines (e.g., the third metal lines L3 shown in FIG. 3A), a line width of the third metal lines L3 may be configured to be between 30 µm and 150 µm (including both ends). A minimum distance between two adjacent third metal lines L3 may be configured to be between approximately 2 µm and 100 µm (including both ends), such that the third metal lines L3 may have the same technical performance as the first metal lines L1.

The display panel according to the disclosed embodiments may be display panels for various application scenarios, such as, liquid crystal display panel. When the display panel according to the present disclosure is a liquid crystal display panel, a corresponding cover may be a color film substrate.

In one embodiment, the display panel may be an organic light-emitting display panel.

Because the organic light emitting display panel is often encapsulated by frit sealant, when the display panel according to the present disclosure is an organic light emitting display panel, the beneficial effects of the present disclosure may be more obvious.

In certain embodiments, the driving circuit unit (e.g., the driving circuit unit VSR shown in FIG. 1B, FIG. 3A, and FIG. 6A) may be a shift register configured to supply shifting scanning signals to the display panel.

In one embodiment, the input signals supplied by the first metal lines L1 to the driving circuit unit VSR may include activation signals, clock signals, a first level signal, and a second level signal.

The clock signal may include a plurality of clock signals, for example, a first clock signal and a second clock signal, etc. The first level signal and the second level signal may be signals of different levels. For example, the first level signal may be a high level signal, and the second level signal may be a low level signal.

In addition, the first metal lines L1 may also supply a reset signal to the driving circuit unit VSR to reset the driving circuit unit VSR.

In one embodiment, the first metal lines L1 may be made of at least one of Mo, Ti, W, and Al/Nd alloy.

Because the first metal lines L1 transfer the said input signals, the first metal lines L1 may be configured to have a desired conductivity. The metal Mo, Ti, W and metal alloy Al/Nd may have the desired conductivity. When the first metal layer M1 is made of at least one of the metallic materials described, the transmission of the input signals in the display panel may be more stable.

In addition, the present disclosure also provides a fabrication method for forming any one of the display panels according to the disclosed embodiments.

Figure 7:
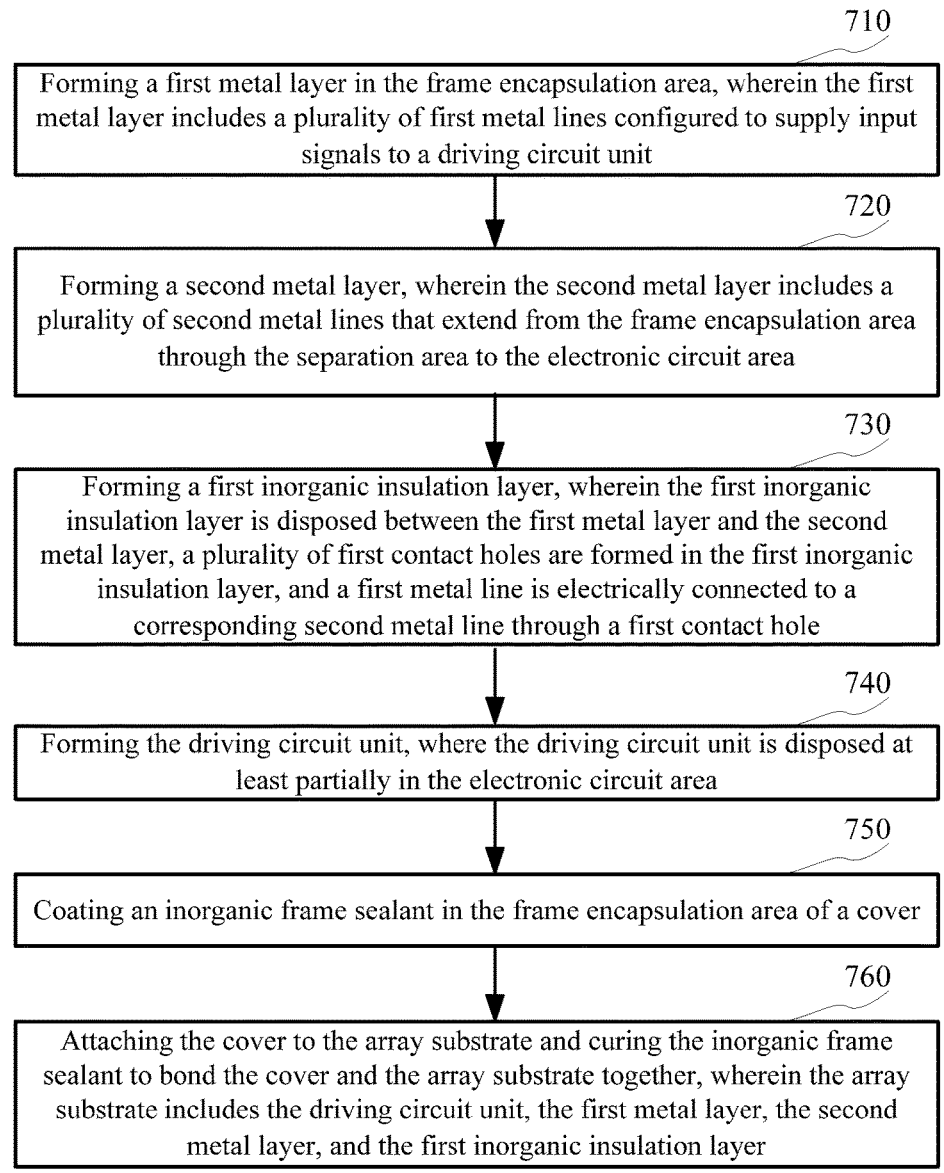
FIG. 7 illustrates a flow chart of an exemplary display panel fabrication method according to the disclosed embodiments.

FIG. 7 illustrates a flow chart of an exemplary display panel fabrication method according to the disclosed embodiments. FIGS. 8A-8F illustrate various cross-sectional views of an exemplary display panel at different stages of the fabrication process according to the disclosed embodiments.

The display panel may include an array substrate, a cover, and an inorganic frame sealant bonding the array substrate and the cover together. The display panel may include a display area and a peripheral area surrounding the display area. The peripheral area may include a frame encapsulation area, a separation area, and an electronic circuit area. The electronic circuit area may be configured between the display area and the separation area. The separation area may be configured between the frame encapsulation area and the electronic circuit area. The fabrication method for the display panel may include the following steps.

As shown in FIG. 7, a first metal layer is formed in the frame encapsulation area, the first metal layer includes a plurality of first metal lines configured to supply input signals to the driving circuit unit (S710). The corresponding structure is shown in FIG. 8A.

Figure 8A:
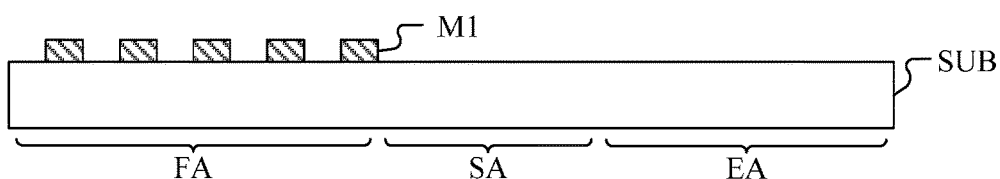
FIGS. 8A-8F illustrate various cross-sectional views of an exemplary display panel at different stages of the fabrication process according to the disclosed embodiments.

Referring to FIG. 8A, the first metal layer M1 may be formed in the frame encapsulation area FA of the substrate SUB. The first metal layer M1 may include a plurality of first metal lines configured to supply input signals to the driving circuit unit VSR.

Returning to FIG. 8A, a second metal layer is formed, the second metal layer includes a plurality of second metal lines that extend from the frame encapsulation area through the separation area to the electronic circuit area (S720). The corresponding structure is shown in FIG. 8C.

Figure 8B:
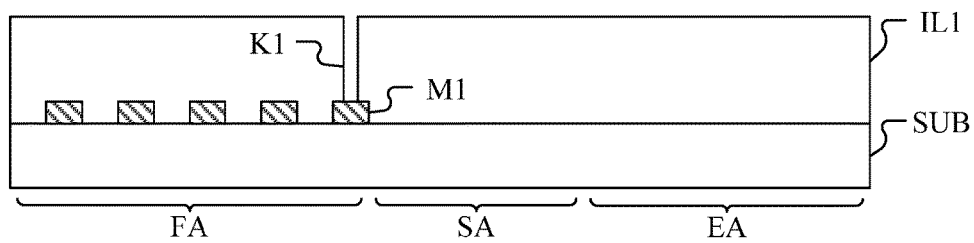
Figure 8C:
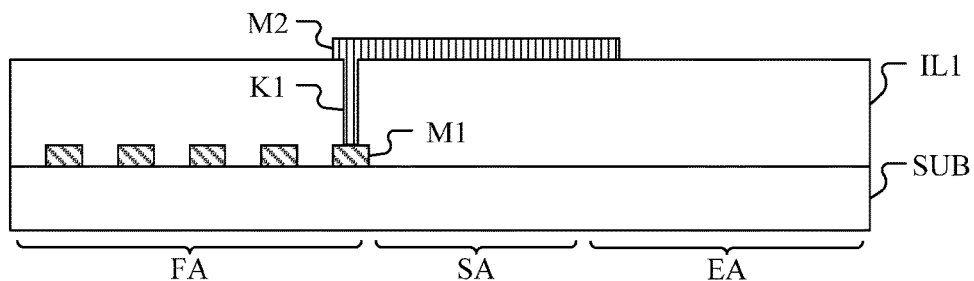

Referring to FIG. 8C, the second metal layer M2 may include a plurality of second metal lines. The second metal lines may extend from the frame encapsulation area FA through the separation area SA to the electronic circuit area EA. The second metal lines may be electrically connected to the first metal lines through the first contact holes K1.

Returning to FIG. 7, a first inorganic insulation layer is formed between the first metal layer and the second metal layer, a plurality of first contact holes are formed in the first inorganic insulation layer (S730). In particular, the first metal layer is electrically connected to the second metal layer through the first contact holes. The corresponding structure is shown in FIG. 8B.

Referring to FIG. 8B, the first inorganic insulation layer IL1 may be formed on the substrate SUB and the first metal layer M1. A plurality of first contact holes K1 may be formed in the first inorganic insulation layer IL1.

Returning to FIG. 7, a driving circuit unit disposed at least partially in the electronic circuit area is formed (S740). The corresponding structure is shown in FIG. 8D.

Figure 8D:
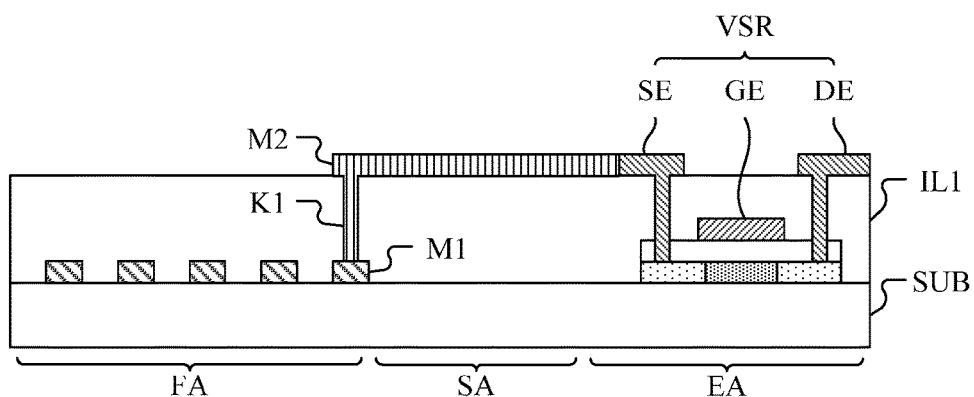

Referring to FIG. 8D, the driving circuit unit VSR may be formed on the substrate SUB. The driving circuit unit VSR may be electrically connected to the second metal lines configured to receive the input signals. The driving circuit unit VSR may be a multi-layer structure.

Returning to FIG. 7, an inorganic frame sealant is coated in the frame encapsulation area of the cover (S750). The corresponding structure is shown in FIG. 8E.

Figure 8E:
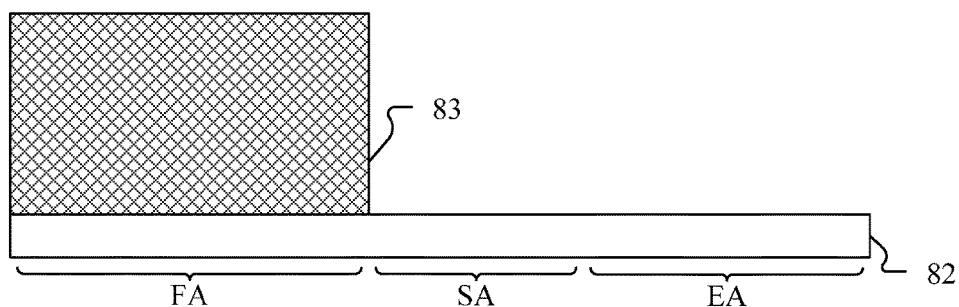

Referring to FIG. 8E, the inorganic frame sealant 83 may be coated in the frame encapsulation area FA of the cover 82.

Returning to FIG. 7, the cover is attached to the array substrate and the inorganic frame sealant is cured (S760). Thus, the cover and the array substrate are bonded together. The array substrate includes a driving circuit unit, a first metal layer, a second metal layer, and an inorganic insulation layer. The corresponding structure is shown in FIG. 8F.

Figure 8F:
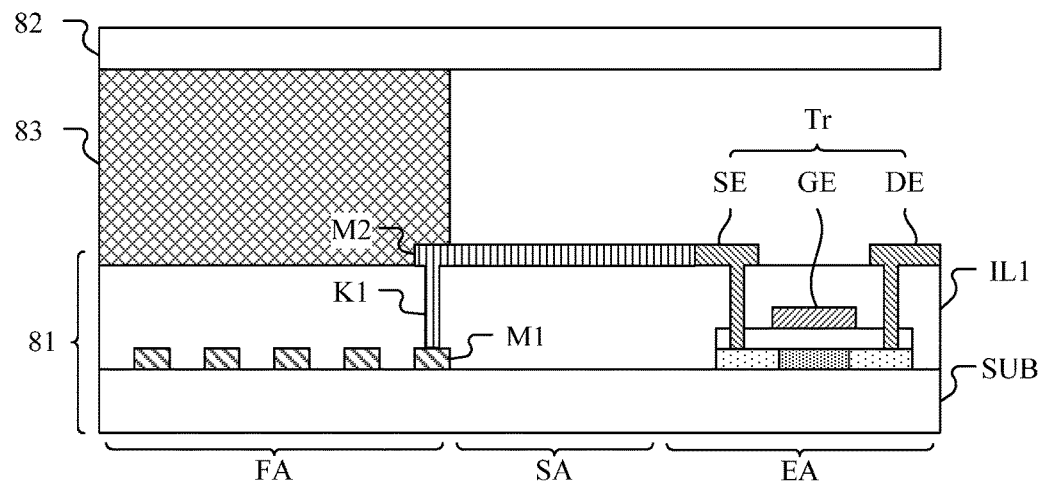

Referring to FIG. 8F, the cover 82 may be placed on the array substrate 81. The inorganic frame sealant 83 may be cured to bond the cover 82 and the array substrate 81 together. The array substrate 81 may include the substrate SUB, the driving circuit unit VSR, the first metal layer M1, the second metal layer M2, and the first inorganic insulation layer IL1 that are formed on the substrate SUB.

FIG. 7 illustrates an order of execution from step S710 through step S760, which is for illustrative purposes and is not intended to limit the scope of the present disclosure. The step S710 through step S760 may be executed in an order different from the order shown in the flow chart in FIG. 7. The first metal layer M1, the first inorganic insulation layer IL1 the second metal layer M2, and the driving circuit unit VSR may be formed in a different order. For example, the second metal layer may be formed before the first metal layer is formed (i.e., step S720 may be executed before step S710). Based on the functions involved, the driving circuit unit VSR may be formed at the same time when the first metal layer M1, the first inorganic insulation layer IL1 and the second metal layer M2 are formed.

In the display panel formed by the fabrication process, the first metal lines (i.e., the first metal layer) that supply the input signals to the driving circuit unit may be formed in the frame encapsulation area, such that the layout area occupied by the electronic circuit area and the frame encapsulation area may be reduced. Thus, the area of the peripheral area may be reduced to facilitate narrow bezel design of the display panel.

In one embodiment, the fabrication method of the display panel may also include forming a third metal layer in the frame encapsulation area. The third metal layer may include a plurality of third metal lines. The third metal lines may be electrically connected to the first metal lines and the second metal lines. An orthogonal projection of the third metal line on the first metal layer may at least partially cover a gap between two adjacent first metal line.

The formation process of the third metal lines may be similar to the formation process of the first metal lines M1, as shown in FIG. 8A. The first metal layer M1, the second metal layer M2, and the third metal layer may not be coplanar with each other.

Through forming the third metal layer and configuring the gap between the adjacent first metal lines to at least partially overlap with the third metal line, not only the resistance of the input signal lines may be reduced, but also the metal reflection area may be increased. Thus, the desired input signals may be obtained, and the more reliable encapsulation may be achieved.

The first metal layer M1, the second metal layer M2, and the third metal layer may be formed in any appropriate order. For example, in one embodiment, the third metal layer may formed first, then the first metal layer M1 and the second metal layer M2 may be formed sequentially, in another embodiment, the second metal layer M2 may be formed first, then the third metal layer and the first metal layer M1 may be formed sequentially, as long as the orthogonal projection of the third metal line on the first metal layer M1 at least partially covers the gap between the adjacent first metal lines. Those skilled in the art may determined the formation order of the first metal layer M1, the second metal layer M2, and the third metal layer according to various practical application scenarios, which is not limited by the present discourse.

In one embodiment, forming the driving circuit unit VSR may include forming a plurality of thin-film-transistors (TFT) in the electronic circuit area EA.

Referring to FIG. 8D, forming the TFTs in the electronic circuit area EA may include: forming a gate metal layer and a plurality of gate electrodes GE on the gate metal layer in the electronic circuit area EA, and forming a source-drain metal layer and a plurality of source electrodes SE and drain electrodes DE on the source-drain metal layer in the electronic circuit area EA.

In one embodiment, one of the gate metal layer and the source-drain metal layer may be formed coplanar with the first metal layer, and the other may be formed coplanar with the second metal layer.

Through configuring the two electrode layers of the TFTs coplanar with the first metal layer and the second metal layer respectively, the fabrication process of the display panel may be simplified, and the production cost of the display panel may be reduced.

Figure 9:
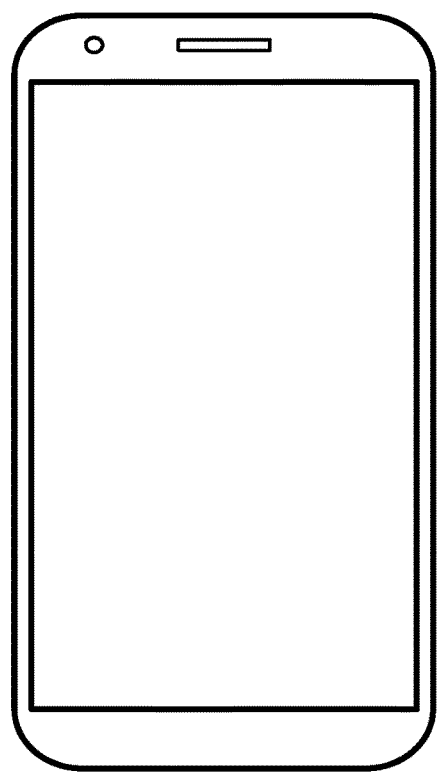
FIG. 9 illustrates a schematic view of an exemplary display apparatus according to the disclosed embodiments.

The present disclosure also provides a display apparatus as shown in FIG. 9. The display apparatus 900 may include any one of the disclosed display panels. In addition to the display panel, the display apparatus 900 may also include other well-known structures which will not be further described here.

The display apparatus of the present disclosure may be any apparatus that includes the disclosed display panel. The display apparatus may be, but not limited to, a cellular phone 900, a tablet computer, a computer display, a display of smart wearable device, or a display device mounted on automobile or other vehicle, as long as the display apparatus includes any one of the disclosed display panels.

The present disclosure provides a display panel, a fabrication method, and a display apparatus. In the disclosed embodiments, the first metal lines that supply the input signals to the driving circuit unit in the electronic circuit area may be disposed in the frame encapsulation area of the display panel. Thus, the layout area occupied by the electronic circuit area and the frame encapsulation area may be reduced, and the narrow bezel design may be achieved.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display panel, comprising:
   an array substrate including a display area and a peripheral are surrounding the display area, wherein the peripheral area includes a frame encapsulation area, a separation area, and an electronic circuit area, the electronic circuit area is disposed between the display area and the separation area, and the separation area is disposed between the frame encapsulation area and the electronic circuit area;
   a cover; and
   an inorganic frame sealant bonding the array substrate and the cover together,
   wherein the array substrate includes a first metal layer disposed in the frame encapsulation area and a driving circuit unit disposed at least partially in the electronic circuit area,
   the first metal layer includes a plurality of first metal lines configured to supply input signals to the driving circuit unit, and
   the inorganic frame sealant is disposed in the frame encapsulation area, and covers the first metal layer.

2. The display panel according to claim 1, further including:
   a first inorganic insulation layer; and
   a second metal layer, wherein:
   the first inorganic insulation layer is disposed between the first metal layer and the second metal layer;
   the second metal layer includes a plurality of second metal lines;
   the plurality of second metal lines extend from the frame encapsulation area through the separation area to the electronic circuit area;
   a first metal line is electrically connected to the driving circuit unit through a corresponding second metal line; and
   the first metal layer is disposed in a metal layer different from the second metal layer.

3. The display panel according to claim 2, wherein:
   the array substrate further includes a third metal layer disposed in the frame encapsulation area;
   the third metal layer includes a plurality of third metal lines;
   the plurality of third metal lines are one-to-one correspondingly electrically connected to the plurality of first metal lines;
   the first metal layer, the second metal layer, and the third metal layer are respectively disposed in different metal layers; and
   an orthogonal projection of a third metal line onto the first metal layer at least partially covers a gap between two adjacent first metal lines.

4. The display panel according to claim 3, wherein:
   the orthogonal projection of the third metal line onto the first metal layer completely covers the gap between the two adjacent first metal lines.

5. The display panel according to claim 2, wherein the array substrate further includes:
   a gate metal layer; and
   a source-drain metal layer,
   wherein:
   one of the gate metal layer and the source-drain metal layer is configured coplanar with the first metal layer; and
   the other of the gate metal layer and the source-drain metal layer is configured coplanar with the second metal layer.

6. The display panel according to claim 2, wherein:
   the first inorganic insulation layer includes a material of at least one of $SiO_2$, $SiN_x$, and SiON; and
   the inorganic frame sealant includes an adhesive containing Si.

7. The display panel according to claim 2, wherein:
   the driving circuit unit includes at least one capacitor;
   the capacitor includes a first capacitor electrode plate and a second capacitor electrode plate configured facing toward each other; and
   the first capacitor electrode plate and the second capacitor electrode plate are disposed in at least one of the separation area and the frame encapsulation area.

8. The display panel according to claim 7, wherein:
   one of the first capacitor electrode plate and the second capacitor electrode plate is disposed coplanar with the first metal layer; and
   the other of the first capacitor electrode plate and the second capacitor electrode plate is disposed coplanar with the second metal layer.

9. The display panel according to claim 1, wherein the array substrate further includes:
   a second inorganic insulation layer disposed between the first metal layer and the inorganic frame sealant.

10. The display panel according to claim 1, wherein:
    a line width w of a first metal line is approximately 30 $\mu m \leq w \leq 150$ $\mu m$.

11. The display panel according to claim 1, wherein:
    a minimum distance d between two adjacent first metal lines is approximately 2 $\mu m \leq d \leq 100$ $\mu m$.

12. The display panel according to claim 1, wherein:
    a minimum distance p between the frame encapsulation area and the electronic circuit area is approximately 30 $\mu m \leq p \leq 200$ $\mu m$.

13. The display panel according to claim 1, wherein:
    a plurality of openings are configured in the plurality of first metal lines; and
    an opening penetrates through a first metal line.

14. The display panel according to claim 1, wherein:
    the driving circuit unit fluffier includes thin-flip-transistors at least partially configured in the electronic circuit area, wherein the thin-film-transistors are configured outside the frame encapsulation area.

15. The display panel according to claim 1, wherein:
the display panel is an organic light-emitting display panel.

16. The display panel according to claim 1, wherein:
the input signals supplied by the plurality of first metal lines to the driving circuit unit include activation signals, clock signals, and scanning signals.

17. A display apparatus, comprising a display panel including:
an array substrate including a display area and a peripheral area surrounding the display area, wherein the peripheral area includes a frame encapsulation area, a separation area, and an electronic circuit area, the electronic circuit area is disposed between the display area and the separation area, and the separation area is disposed between the frame encapsulation area and the electronic circuit area;
a cover; and
an inorganic frame sealant bonding the array substrate and the cover together,
wherein the array substrate includes a first metal layer disposed in the frame encapsulation area and a driving circuit unit disposed at least partially in the electronic circuit area,
the first metal layer includes a plurality of first metal lines configured to supply input signals to the driving circuit unit, and
the inorganic frame sealant is disposed in the frame encapsulation area, and covers the first metal layer.

18. A fabrication method for a display panel comprising:
an array substrate including a display area and a peripheral area surrounding the display area, wherein the peripheral area includes a frame encapsulation area, a separation area, and an electronic circuit area, the electronic circuit area is disposed between the display area and the separation area, and the separation area is disposed between the frame encapsulation area, and the electronic circuit area, wherein the fabrication method comprising:
forming a first metal layer in the frame encapsulation area, wherein the first metal layer includes a plurality of first metal lines configured to supply input signals to a driving circuit unit;
forming a second metal layer, wherein the second metal layer includes a plurality of second metal lines that extend from the frame encapsulation area through the separation area to the electronic circuit area;
thrilling a first inorganic insulation layer, wherein the first inorganic insulation layer is disposed between the first metal layer and the second metal layer, a plurality of first contact holes are formed in the first inorganic insulation layer, and a first metal line is electrically connected to a corresponding second metal line through a first contact hole;
forming the driving circuit unit, wherein the driving circuit unit is disposed at least partially in the electronic circuit area;
coating an inorganic frame sealant in a frame encapsulation area of a cover; and
attaching the cover to the array substrate and curing the inorganic frame sealant to bond the cover and the array substrate together, wherein the array substrate includes the driving circuit unit, the first metal layer, the second metal layer, and the first inorganic insulation layer.

19. The fabrication method according to claim 18, further including:
forming a third metal layer in the frame encapsulation area of the array substrate, wherein:
the third metal layer includes a plurality of third metal lines;
the first metal layer, the second metal layer, and the third metal layer are respectively configured in different metal layers;
a third metal line is electrically connected to a corresponding second metal line; and
an orthogonal projection of the third metal line on the first metal layer at least partially covers a gap between adjacent first metal lines.

20. The fabrication method according to claim 18, further including:
forming agate metal layer; and
forming a source-drain metal layer, wherein:
one of the gate metal layer and the source-drain metal layer is configured coplanar with the first metal layer; and
the other of the gate metal layer and the source drain metal layer is configured coplanar with the second metal layer.

* * * * *